(12) United States Patent
Yamaguchi

(10) Patent No.: US 10,840,084 B2
(45) Date of Patent: Nov. 17, 2020

(54) METHOD OF MANUFACTURING SEMICONDUCTOR DEVICE AND SUBSTRATE PROCESSING APPARATUS

(71) Applicant: TOKYO ELECTRON LIMITED, Tokyo (JP)

(72) Inventor: Tatsuya Yamaguchi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/165,176

(22) Filed: Oct. 19, 2018

(65) Prior Publication Data

US 2019/0131125 A1    May 2, 2019

(30) Foreign Application Priority Data

Oct. 26, 2017    (JP) .................. 2017-207428

(51) Int. Cl.

| | | |
|---|---|---|
| H01L 21/02 | (2006.01) | |
| H01L 43/12 | (2006.01) | |
| H01L 21/673 | (2006.01) | |
| H01L 21/324 | (2006.01) | |
| H01L 21/3213 | (2006.01) | |
| H01L 21/67 | (2006.01) | |
| H01L 21/768 | (2006.01) | |
| H01L 45/00 | (2006.01) | |

(Continued)

(52) U.S. Cl.
CPC .... *H01L 21/02118* (2013.01); *H01L 21/0228* (2013.01); *H01L 21/02271* (2013.01); *H01L 21/02282* (2013.01); *H01L 21/3105* (2013.01); *H01L 21/31116* (2013.01); *H01L 21/31138* (2013.01); *H01L 21/324* (2013.01); *H01L 21/32133* (2013.01); *H01L 21/32139* (2013.01); *H01L 21/6715* (2013.01); *H01L 21/67103* (2013.01); *H01L 21/67248* (2013.01); *H01L 21/67366* (2013.01); *H01L 21/768* (2013.01); *H01L 43/12* (2013.01); *H01L 45/04* (2013.01); *H01L 45/06* (2013.01); *H01L 45/1233* (2013.01); *H01L 45/16* (2013.01)

(58) Field of Classification Search
CPC ......... H01L 21/02118; H01L 21/02271; H01L 21/0228; H01L 21/02282
USPC ........................................ 438/780
See application file for complete search history.

(56) References Cited

U.S. PATENT DOCUMENTS 6,495,208 B1 * 12/2002 Desu ................ C23C 16/30
427/255.31
9,414,445 B2    8/2016 Ahmad et al.
(Continued)

*Primary Examiner* — Sheikh Maruf
(74) *Attorney, Agent, or Firm* — Nath, Goldberg & Meyer; Jerald L. Meyer

(57) ABSTRACT

A method of manufacturing a semiconductor device includes: forming a protective material composed of a polymer having a urea bond by supplying a raw material for polymerization to a surface of a substrate for manufacturing the semiconductor device, the protective material configured to protect a protection target layer provided in the substrate against a treatment to be performed on the substrate; subsequently performing the process on the substrate on which the protective material is formed; and subsequently removing the protective material by heating the substrate under a low oxygen atmosphere to depolymerize the polymer.

6 Claims, 15 Drawing Sheets

(51) Int. Cl.
*H01L 21/311* (2006.01)
*H01L 21/3105* (2006.01)

(56) References Cited

U.S. PATENT DOCUMENTS

| | | | | |
|---|---|---|---|---|
| 2003/0232495 | A1* | 12/2003 | Moghadam | B05D 1/60 438/623 |
| 2005/0014388 | A1* | 1/2005 | Takahashi | H01L 21/02271 438/780 |
| 2006/0051972 | A1* | 3/2006 | Chen | H01L 21/76808 438/763 |
| 2010/0295023 | A1* | 11/2010 | Franklin | B82Y 10/00 257/24 |
| 2013/0072029 | A1* | 3/2013 | Yamaguchi | H01L 21/02304 438/780 |
| 2013/0111753 | A1* | 5/2013 | Nihei | B41J 2/1433 29/890.1 |
| 2014/0322921 | A1* | 10/2014 | Ahmad | H05B 6/80 438/780 |
| 2014/0353802 | A1* | 12/2014 | Licausi | H01L 21/314 257/622 |
| 2015/0064931 | A1* | 3/2015 | Kumagai | H01L 21/02271 438/780 |
| 2015/0079805 | A1* | 3/2015 | Rogers | H01L 21/31058 438/780 |
| 2015/0115415 | A1* | 4/2015 | Mischitz | H01L 21/78 257/632 |
| 2015/0162189 | A1* | 6/2015 | Xie | C23C 16/482 438/780 |
| 2015/0234279 | A1* | 8/2015 | Fujiwara | H01L 21/3086 438/763 |
| 2016/0009958 | A1* | 1/2016 | Moore | C09J 183/04 428/417 |
| 2016/0011512 | A1* | 1/2016 | Nakafuji | C08G 65/38 106/287.25 |
| 2016/0155633 | A1* | 6/2016 | Zhou | C08J 3/24 257/632 |
| 2018/0025917 | A1* | 1/2018 | Yatsuda | H01L 21/76811 438/694 |

* cited by examiner

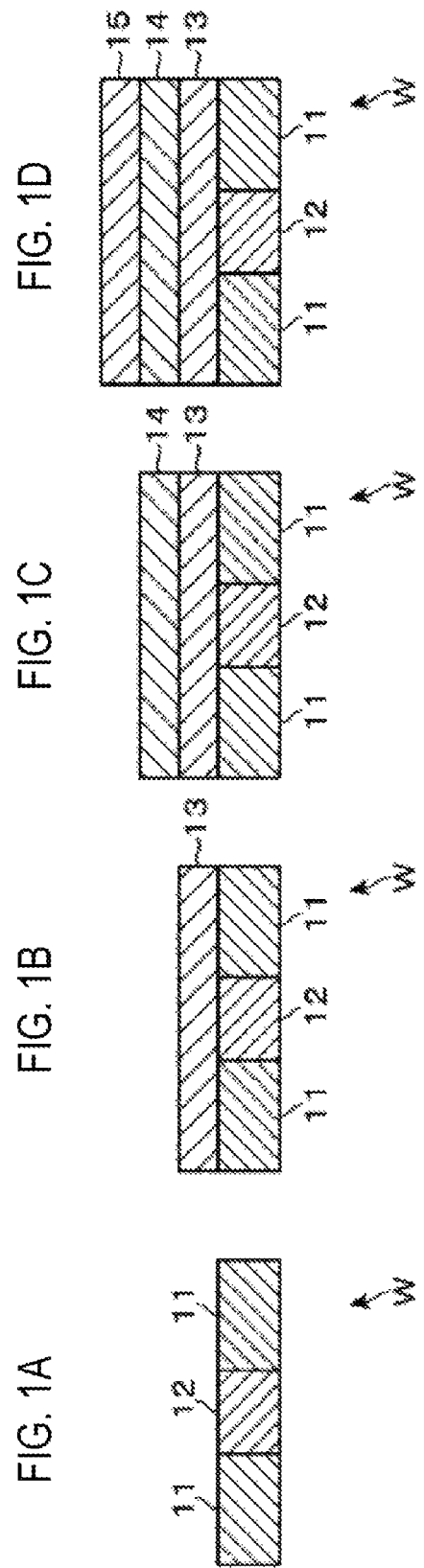

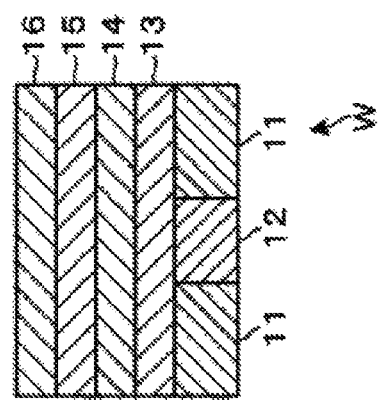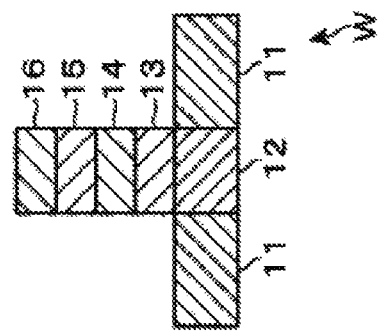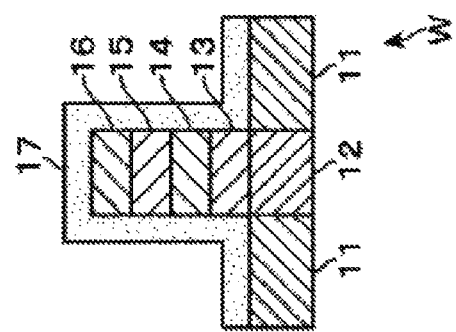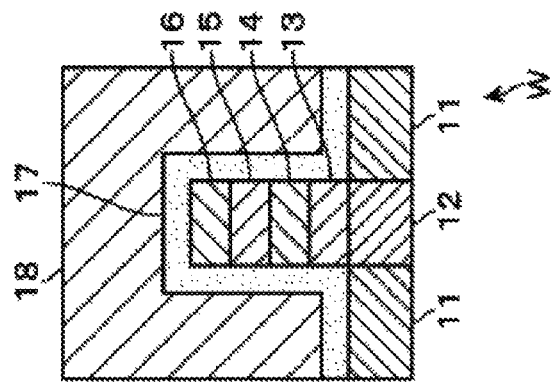

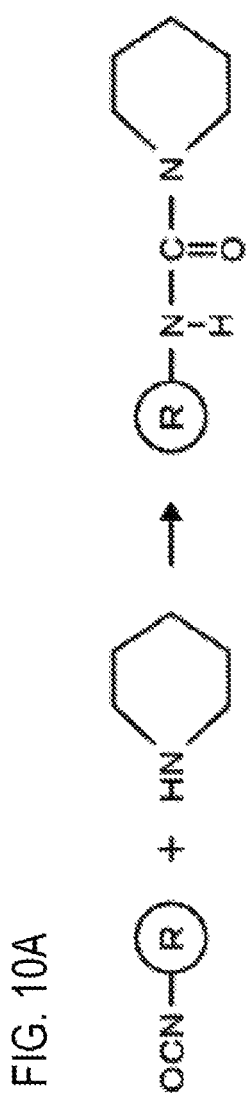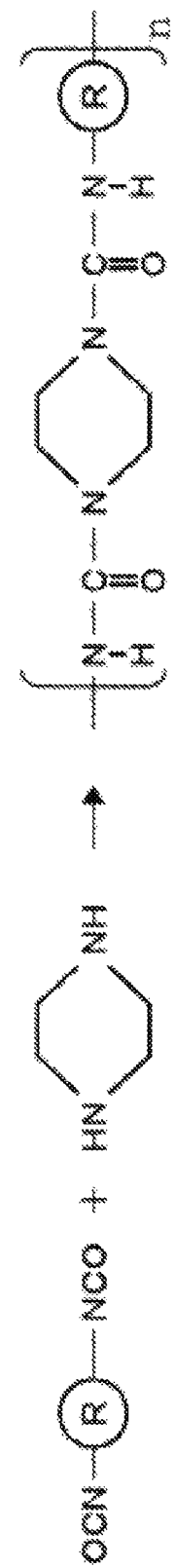
FIG. 10A
FIG. 10B

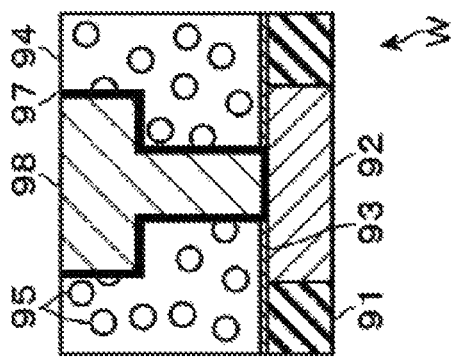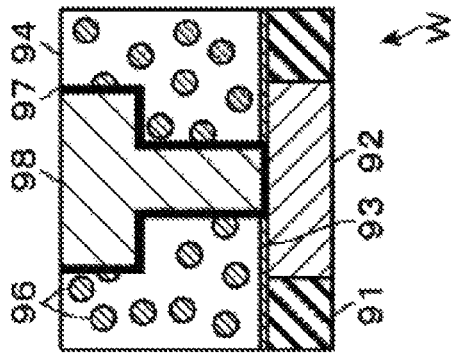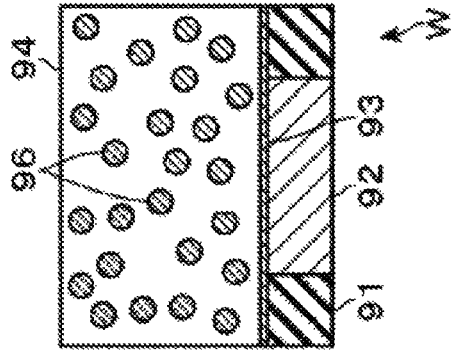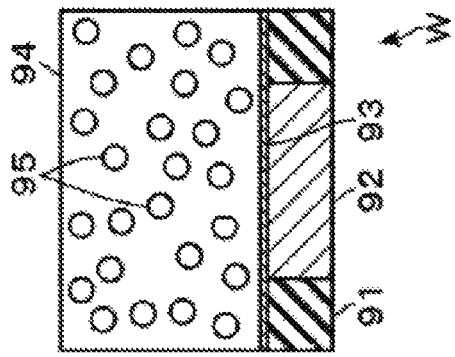

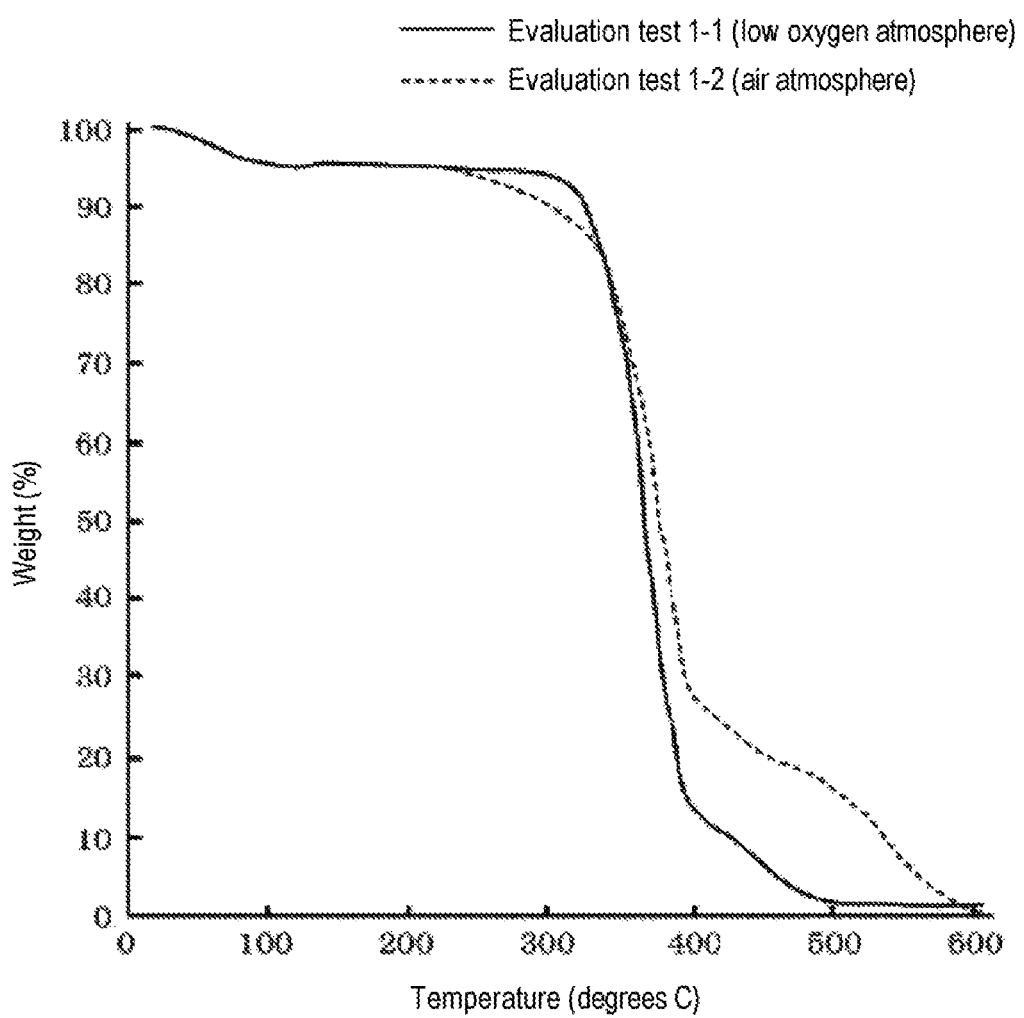

US 10,840,084 B2

METHOD OF MANUFACTURING SEMICONDUCTOR DEVICE AND SUBSTRATE PROCESSING APPARATUS

CROSS-REFERENCE TO RELATED APPLICATION

This application is based upon and claims the benefit of priority from Japanese Patent Application No. 2017-207428, filed on Oct. 26, 2017, the entire contents of which are incorporated herein by reference.

TECHNICAL FIELD

The present disclosure relates to a technique for forming a polymer having a urea bond on a substrate and then performing a process to manufacture a semiconductor device.

BACKGROUND

In a manufacturing process of a semiconductor device, various films are formed on a substrate such as, for example, a semiconductor wafer (hereinafter referred to as a wafer) or the like. One of these films is a sacrificial film. The sacrificial film is formed on a film, prior to performing a process such as etching or the like, to protect the film formed below the sacrificial film, and is removed after performing the process. The sacrificial film is composed of an organic film such as a resist or the like, and is removed by, for example, plasma treatment using oxygen or oxidative combustion at a relatively high temperature.

Also, when plasma treatment such as etching or ashing is performed to embed a wiring in a porous low dielectric constant film used as an interlayer insulating film, the low dielectric constant film is damaged. In order to suppress such damage, it has been studied that a material different from the low dielectric constant film is embedded in pores and the material (embedded material) is removed when it becomes unnecessary after the plasma treatment. Specifically, there is known a method in which PMMA (acrylic resin) as a polymer is embedded as the embedded material and is removed after a process such as etching or the like is performed on a low dielectric constant film.

As described above, the sacrificial film as an organic film is removed by oxidation reaction. However, it may be a concern that a surface of metal constituting a conductive path is oxidized by the removal process of the sacrificial film, which may affect quality of a semiconductor device. This problem can be solved by carrying out a reduction process after the removal process of the sacrificial film. However, the reduction process results in increase in time and the number of processes, which makes it difficult to improve productivity of the semiconductor device. For example, when removing the embedded material in the above-described method, a substrate is heated, a solvent is supplied, and a microwave is supplied. That is to say, removal of PMMA requires many processes. Further, since it is necessary to take as long as about 20 minutes for a plasma treatment and to heat the substrate to a temperature of 400 degrees C. or higher in order to remove PMMA, it is highly likely that device elements already formed on the substrate are adversely affected. In order to avoid deterioration of quality of a semiconductor device, it is necessary to reliably remove the sacrificial film or the embedded material by a removal process without leaving residues on the substrate.

SUMMARY

Some embodiments of the present disclosure provide a technique capable of preventing deterioration of quality of a semiconductor device when a protective material is formed on a substrate to protect a protection target layer against a treatment performed on the substrate and the protective material is removed after the treatment in a manufacturing process of the semiconductor device.

One embodiment of the present disclosure provides a method of manufacturing a semiconductor device including: forming a protective material composed of a polymer having a urea bond by supplying a raw material for polymerization to a surface of a substrate for manufacturing the semiconductor device, the protective material configured to protect a protection target layer provided in the substrate against a treatment to be performed on the substrate; subsequently performing the process on the substrate on which the protective material is formed; and subsequently removing the protective material by heating the substrate under a low oxygen atmosphere to depolymerize the polymer.

Another embodiment of the present disclosure provides a substrate processing apparatus including: a process container configured to store a substrate for manufacturing a semiconductor device, the substrate having a protection target layer and a protective material composed of a polymer having a urea bond, the protective material configured to protect the protection target layer against a treatment to be performed on the substrate; a low oxygen atmosphere forming part configured to form a low oxygen atmosphere in the process container; and a heating part configured to remove the protective material by heating the substrate stored in the process container under the low oxygen atmosphere to depolymerize the polymer.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 1A to 1D are explanatory views showing a part of a semiconductor device manufacturing process according to an embodiment of the present disclosure.

FIGS. 2A to 2D are explanatory views showing a part of the semiconductor device manufacturing process according to the embodiment of the present disclosure.

FIGS. 10A and 10B are explanatory views showing how a polymer having a urea bond is produced by using secondary amine.

FIGS. 13A to 13D are explanatory views showing a part of the semiconductor device manufacturing process according to the embodiment of the present disclosure.

FIG. 14 is a graph showing results of an evaluation test.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An embodiment in which the present disclosure is applied to a process of forming a memory element as a semiconductor device will be described. First, the outline of the present embodiment will be briefly described. In the present embodiment, a contact hole for embedding metal serving as a conductive path of a memory element is formed in a wafer W as a substrate for manufacturing a semiconductor. By forming a protective film made of polyurea as a polymer containing a urea bond before the formation of the contact hole, an electrode film formed in a lower layer of the protective film is prevented from being damaged by overetching that may occur at the time of forming the contact hole. This protective film is a sacrificial film for the electrode film and is removed by depolymerization after the formation of the contact hole and before embedding the metal.

A series of processes of the present embodiment will be described with reference to FIGS. 1A to 3C which are vertical sectional side views of a wafer W. FIGS. 1A to 1D show a sequence in which a memory element film 13 for forming a memory element is formed on an electrode 12 of a lower layer circuit surrounded by an insulating film 11, an electrode film 14 constituting a conductive path of the memory element is formed so as to be stacked on the memory element film 13, and a protective film (polyurea film) 15 as a protective material is formed so as to be stacked on the electrode film 14 as a protection target layer. Examples of the memory element include a ReRAM, a PCRAM, an MRAM, and the like. Examples of the memory element film 13 include a metal oxide film used for the ReRAM (variable resistance memory).

Figure 4:
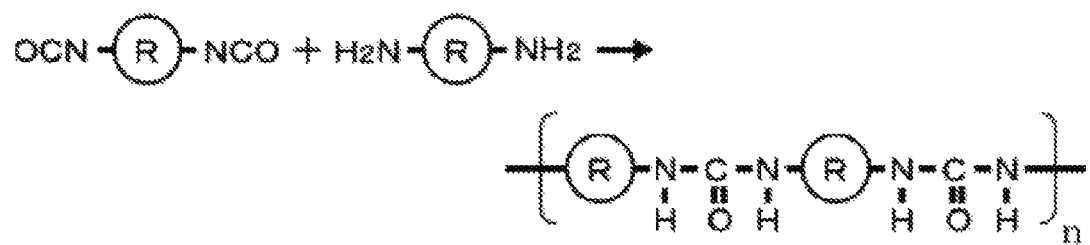
FIG. 4 is an explanatory view showing how a polymer having a urea bond is produced by a reaction of copolymerization.

The electrode film 14 is formed of, for example, a laminated film in which a titanium nitride (TiN) film and a tungsten (W) film are laminated in this order from below. For example, as shown in FIG. 4, the protective film (polyurea film) 15 made of polyurea is produced by copolymerization using isocyanate and amine. In FIG. 4, R is, for example, an alkyl group (linear alkyl group or cyclic alkyl group) or an aryl group, and n is an integer of 2 or more. A thickness of the protective film 15 is set to, for example, 20 nm to 50 nm.

Next, a mask film (hard mask) 16 is formed on the protective film 15 (see FIG. 2A). Examples of the mask film 16 include a boron (B)-containing silicon film. The boron (B)-containing silicon film is formed using, for example, a silane-based gas and a $B_2H_6$ gas as a doping gas. Thereafter, a resist pattern is formed on the mask film 16, whereby a pattern is formed on the mask film 16. The protective film 15, the electrode film 14, and the memory element film 13 are etched using the mask film 16 as a hard mask, thereby transferring the pattern (see FIG. 2B).

Next, a sealing film 17 made of, for example, a polyimide film is formed so as to cover an upper surface and a side surface of a laminated structure including the mask film 16, the memory element film 13, the electrode film 14, and the protective film 15 (see FIG. 2C). The sealing film 17 is provided to enhance a heat resistance of the protective film 15. That is to say, the sealing film 17 is provided to suppress depolymerization of the protective film 15 when the protective film 15 is heated to a temperature higher than a depolymerization temperature in the case where the sealing film 17 is not formed. Accordingly, the sealing film 17 is formed at a temperature lower than the depolymerization temperature of polyurea (polymer), for example, at 250 degrees C. or lower.

Further, for example, a silicon oxide film 18 as an insulating film is formed, as an element separation film for electrically separating elements from each other, around the laminated structure including the memory element film 13, the electrode film 14, and the protective film 15, thereby forming a state in which the laminated structure is buried in the silicon oxide film 18 (see FIG. 2D). The silicon oxide film 18 is formed, for example, by CVD at a process temperature of 300 degrees C. under a vacuum atmosphere. The formation process of the silicon oxide film 18 corresponds to a process performed on the wafer W at a temperature higher than the depolymerization temperature of the protective film 15.

Next, for example, a mask having an opening at a position corresponding to the above-described laminated structure is formed on the silicon oxide film 18. Then, an etching process using an etching gas is performed to form a contact hole 19 so as to expose the protective film 15, and the mask is removed (see FIG. 3A). Illustration of this contact-hole-forming mask is omitted. In the foregoing, the respective processes performed until the removal of the resist pattern are performed at a temperature lower than the depolymerization temperature of polyurea. After the contact hole 19 is formed in this way, the wafer W is heated so that depolymerization of polyurea occurs under a low oxygen atmosphere, thereby removing the protective film 15 (see FIG. 3B).

The above-described low oxygen atmosphere is, for example, an atmosphere having an oxygen concentration of 200 ppm or less, and in some embodiments, 50 ppm or less. In order to create the atmosphere having such an oxygen concentration, a vacuum atmosphere of, for example, 10 mTorr ($1.33 \times 10^6$ Pa) or less may be created by evacuating an inside of a process container in which the wafer W is stored, or the inside of the process container may be set to an inert gas atmosphere of the room pressure by, for example, supplying an inert gas into the process chamber. By performing the heating under the low oxygen atmosphere in this manner, the polyurea and the isocyanate and amine, which are monomers produced by depolymerization of the polyurea, are inhibited from being oxidized even when they are heated to a temperature at which the depolymerization occurs. As a result, the respective oxides of polyurea, isocyanate, and amine are prevented from adhering to and remaining on the electrode film 14 as residues. The isocyanate and amine generated by depolymerization are removed from the wafer W by vaporization. After the protective film 15 is removed by depolymerization as described above, metal, for example, copper, as a conductive path is embedded in the contact hole 19, and an excess amount of metal is removed by CMP to form a conductive path 21. Thus, a memory element is manufactured (see FIG. 3C).

Description will be made on the heating temperature of the wafer W when the protective film 15 made of polyurea as mentioned above is removed by depolymerization. When heated to 300 degrees C. or higher, for example, 350 degrees C., polyurea is depolymerized as described above to produce amine and isocyanate and is evaporated. However, in order to not adversely affect a device element already formed on the wafer W, particularly the conductive path made of copper, the depolymerization may be performed in some embodiments by heating the wafer W to a temperature lower than 400 degrees C., for example, 390 degrees C. or lower, and more specifically, for example, 300 to 350 degrees C. The time for depolymerizing polyurea, for example, the time for heating the wafer W to 300 degrees C. to 400 degrees C., may be in some embodiments five minutes or less, for example, from the viewpoint of suppressing thermal damage to the device element.

As described above, according to the present embodiment, the polyurea is formed on the electrode film 14 and serves as the protective film 15 for protecting the electrode film 14 against over-etching which may occur at the time of forming the contact hole 19. When the protective film 15 becomes unnecessary after the formation of the contact hole 19, the protective film 15 is removed by depolymerizing polyurea under a low oxygen atmosphere. As described above, it is necessary to remove the protective film 15 at such a temperature as not to affect the device element already formed on the wafer W. When depolymerizing the protective film 15 as described above, generation of oxides of polyurea, isocyanate, and amine is suppressed. Therefore, even if the temperature at the time of depolymerization is set to be relatively low, it is possible to remove the protective film 15 without leaving the oxides as residues on the electrode film 14 below the protective film 15. Accordingly, in the memory element manufactured from the wafer W, increase in resistance of the electrode film 14 due to residues is suppressed. As a result, it is possible to increase a yield of the semiconductor device. Furthermore, in addition to the fact that no residue remains as described above, the electrode film 14 is suppressed from being oxidized by the removal process of the protective film 15 because the protective film 15 is removed under the low oxygen atmosphere. Accordingly, increase in resistance of the electrode film 14 is also suppressed from this point. In addition, since the removal process of the protective film 15 is performed by heating, which does not require formation of plasma, it is advantageous that the removal process of the protective film 15 can be performed in a simple manner.

Figure 5:
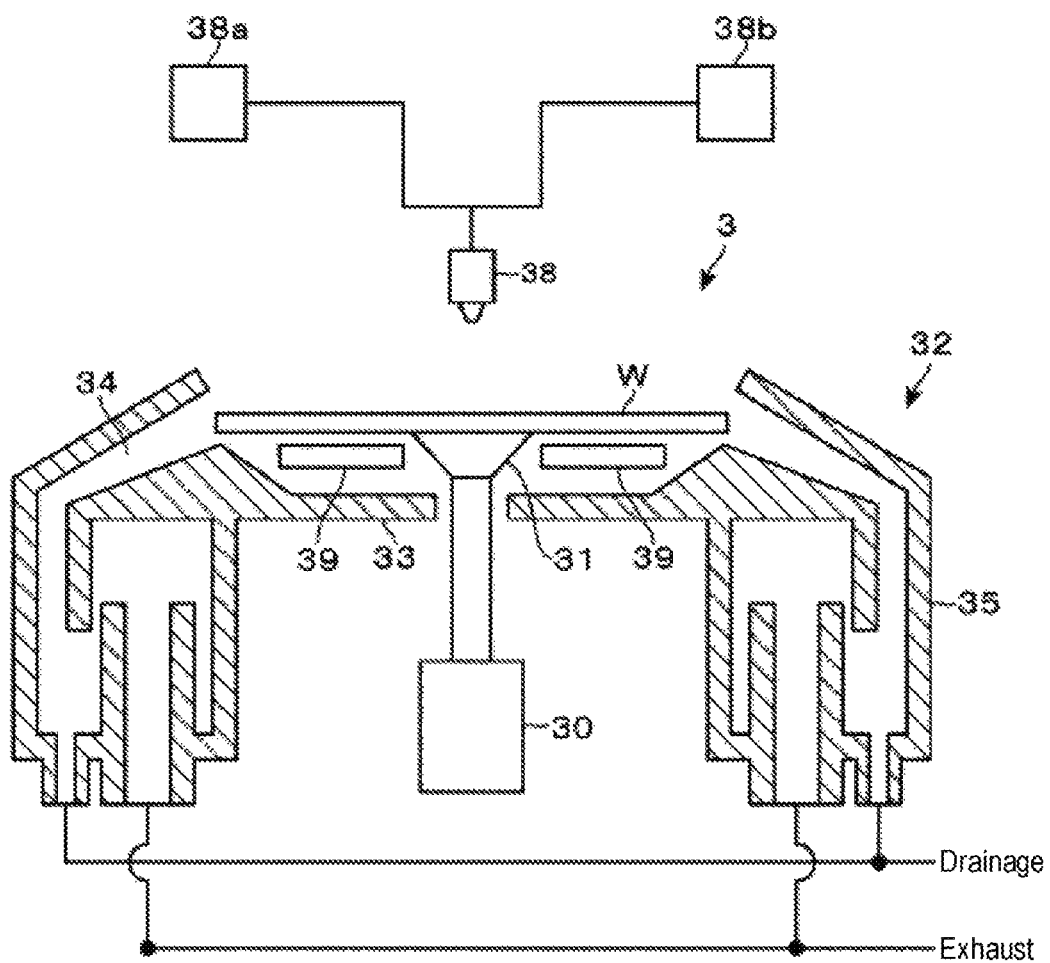
FIG. 5 is a sectional view showing an apparatus for producing a polymer having a urea bond by supplying isocyanate and amine to a substrate.

An example of an apparatus for forming the protective film 15 shown in FIG. 1D in the process of manufacturing the memory element will be described with reference to FIG. 5. FIG. 5 is a vertical sectional side view of a coating apparatus 3 for forming the protective film 15 by spin coating. In FIG. 5, reference numeral 31 denotes a vacuum chuck configured to suck and hold a wafer W and rotated by a rotation mechanism 30. Reference numeral 32 denotes a cup module, and reference numeral 33 denotes a guide member in which an outer peripheral wall and an inner peripheral wall extending downward are formed in a cylindrical shape. Reference numeral 34 denotes a discharge space formed between an outer cup 35 and the outer peripheral wall so that exhaust and drainage can be performed over the entire circumference. A lower side of the discharge space 33 has a structure capable of separating a gas and a liquid.

Reference numeral 38a denotes a supply source of, for example, (1,3-bis (isocyanatomethyl) cyclohexane) (H6XDI) as a chemical liquid, and reference numeral 38b denotes a supply source of, for example, 1,3-bis (aminomethyl) cyclohexane (H6XDA) as a chemical liquid. These H6XDI and H6XDA are polymerization-purpose raw material monomers for forming polyurea. The coating apparatus 3 is configured so that the H6XDI chemical liquid and the H6XDA chemical liquid join together immediately before a nozzle 38 to form a mixed liquid, and the mixed liquid is supplied to a central portion of the wafer W. As the wafer W rotates, the mixed liquid spreads on the wafer W, whereby the protective film 15 is produced. A heating part 39 composed of, for example, a light emitting diode is disposed below the wafer W. The heating part 39 heats the wafer W to promote polymerization.

Figure 6:
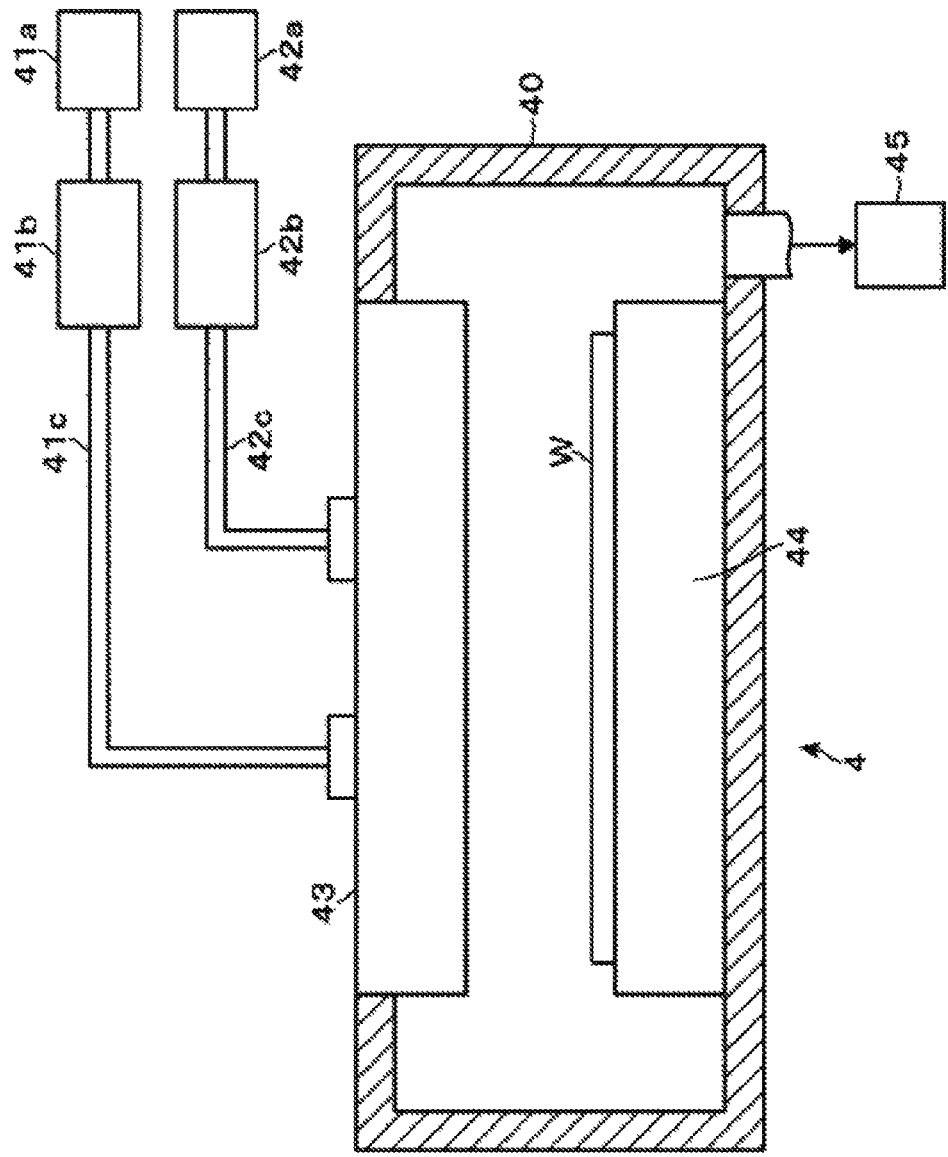
FIG. 6 is a sectional view showing an apparatus for producing a polymer having a urea bond by causing isocyanate and amine to react with each other in a vapor state.

The protective film 15 may be formed by reacting raw material monomers in a gaseous state and performing vapor deposition polymerization. FIG. 6 shows a chemical vapor deposition (CVD) apparatus (film forming apparatus) 4 that performs film formation in such a manner Reference numeral 40 denotes a vacuum container for defining a vacuum atmosphere. Reference numerals 41a and 42a denote raw material supply sources for storing isocyanate and amine as raw material monomers in a liquid state, respectively. An isocyanate liquid and an amine liquid are vaporized by vaporizers 41b and 42b installed in supply pipes 41c and 42c. Each vapor is introduced into a shower head 43 as a gas discharge part. A plurality of discharge holes is formed in the lower surface of the shower head 43, and an isocyanate vapor and an amine vapor are discharged from individual discharge holes into a process atmosphere. The wafer W is placed on a mounting table 44 provided with a temperature control mechanism. First, the isocyanate vapor is supplied to the wafer W, thereby adhering to a surface of the wafer W. Then, the supply of isocyanate vapor is stopped, and the interior of the vacuum container 40 is vacuum-evacuated. Thereafter, the amine vapor is supplied to the wafer W. Isocyanate and amine are caused to react on the surface of the wafer W to form a protective film 15 made of polyurea. Reference numeral 45 in FIG. 6 denotes an exhaust mechanism for evacuating the interior of the vacuum container 40 during the formation process of the protective film 15 to form a vacuum atmosphere of a predetermined pressure.

Figure 3A:
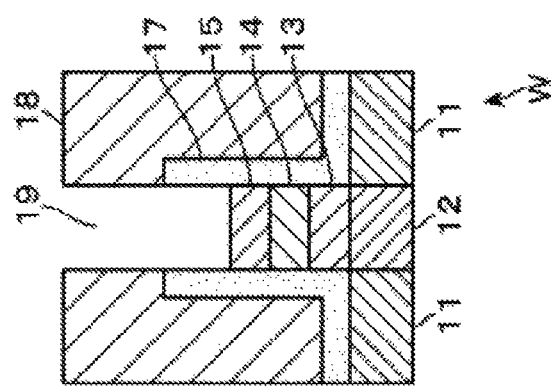
FIGS. 3A to 3C are explanatory views showing a part of the semiconductor device manufacturing process according to the embodiment of the present disclosure.
Figure 3B:
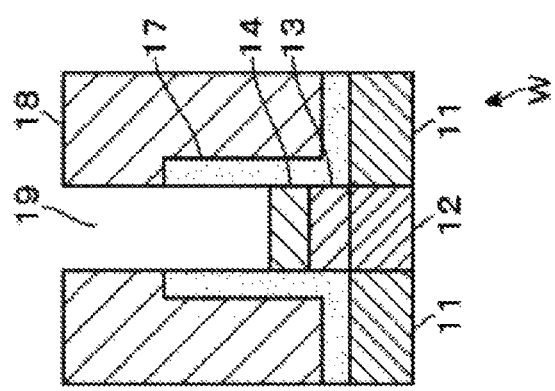
Figure 3C:
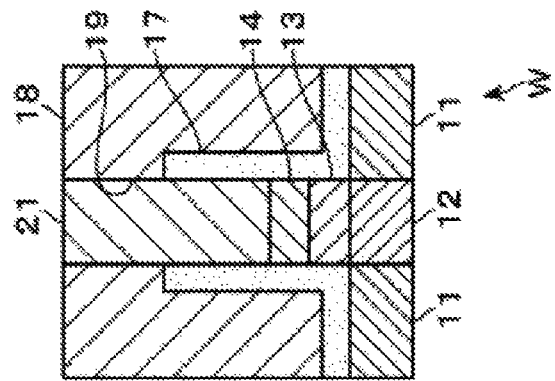
Figure 7:
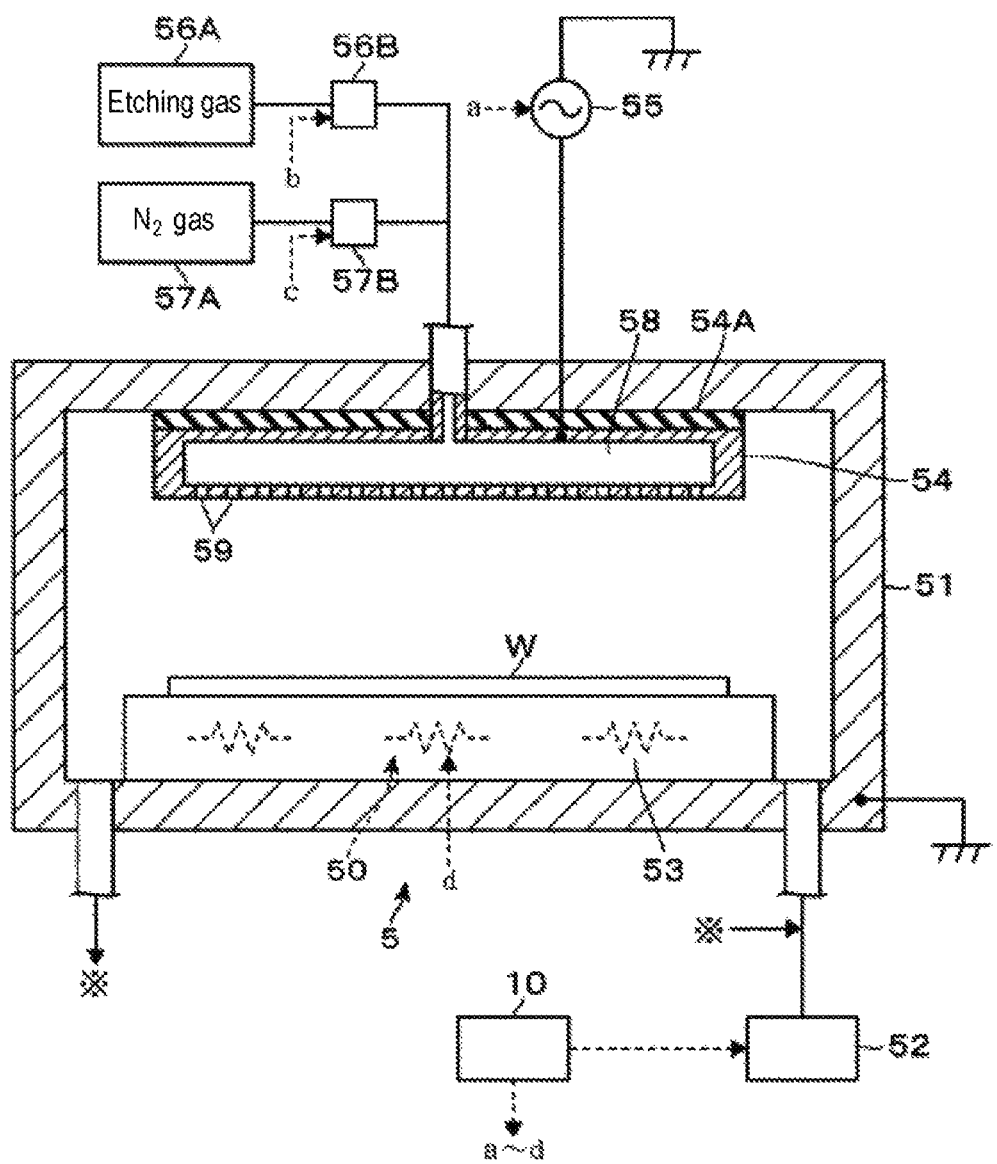
FIG. 7 is a vertical sectional side view of an etching apparatus that performs etching and depolymerization of polyurea in the semiconductor device manufacturing process.

FIG. 7 is a vertical sectional side view of an etching apparatus 5. For example, the formation process of the contact hole 19 as illustrated in FIG. 3A and the removal process of the protective film 15 as illustrated in FIG. 3B can be performed by the etching apparatus 5. The etching apparatus 5 can perform etching by forming capacitively coupled plasma. In FIG. 7, reference numeral 51 denotes a grounded process container. The interior of the process container 51 is evacuated by an exhaust mechanism 52 constituting a low oxygen atmosphere forming part, thereby forming a vacuum atmosphere of a desired pressure.

In FIG. 7, reference numeral 53 denotes a mounting table on which the wafer W is mounted. A heater 50 as a heating part for heating the wafer W is buried in the mounting table 53. The mounting table 53 is electrically connected to the bottom surface of the process container 51. The mounting table 53 serves as a lower electrode and also functions as an anode electrode. A shower head 54 is provided above the mounting table 53 so as to face the upper surface of the mounting table 53. In FIG. 7, reference numeral 54A denotes an insulating member that insulates the shower head 54 from the process container 51. A high-frequency power source 55 for plasma generation is connected to the shower head 54. The shower head 54 functions as a cathode electrode.

In FIG. 7, reference numeral 56A denotes an etching gas supply source. The etching gas supply source supplies an etching gas, which is used in the etching process for forming the contact hole 19 as described in FIG. 3A and in the etching process for removing the mask that is used for forming the contact hole 19, to a diffusion space 58 provided in the shower head 54. In FIG. 7, reference numeral 57A denotes an $N_2$ (nitrogen) gas supply source as an inert gas supply source. The $N_2$ gas supply source supplies an $N_2$ gas to the diffusion space 58 so as to set the inside of the process container 51 to the above-described low oxygen atmosphere. In FIG. 7, reference numerals 56B and 57B denote flow rate adjustment parts for adjusting flow rates of the etching gas and the $N_2$ gas supplied to the diffusion space 58. The etching gas and the $N_2$ gas supplied to the diffusion space 58 are supplied to the wafer W in a shower form through a plurality of discharge holes 59 formed in the lower surface of the shower head 54.

The etching apparatus 5 includes a controller 10 as a computer. The controller 10 includes a program, a memory, and a CPU. The program is stored in a computer-readable storage medium, for example, a compact disk, a hard disk, a magneto-optical disk or the like, and is installed in the controller 10. The controller 10 outputs a control signal to respective components of the etching apparatus 5 according to the program and controls operation of the respective components. Specifically, an on/off state of the high-frequency power supply 55, an exhaust amount of the exhaust mechanism 52, the flow rates of gases by the flow rate adjustment parts 56B and 57B, a power supplied to the heater 50, and the like are controlled by the control signal.

Operation of the etching apparatus 5 will be described. A wafer W on which the silicon oxide film 18 shown in FIG. 2D is formed is loaded into the etching apparatus 5 and is mounted on the mounting table 53. Although not shown, as described above, the mask for forming the contact hole 19 is formed on the silicon oxide film 18. When the interior of the process container 51 is evacuated to a predetermined pressure, the etching gas for forming a contact hole is discharged from the shower head 54, and the high-frequency power supply 55 is turned on. Then, an electric field is formed between the electrodes, and the etching gas is converted into plasma. Thus, the silicon oxide film 18 is etched to form a contact hole 19, and the protective film 15 is exposed on the surface of the wafer W. Thereafter, the etching gas for removing the mask is supplied and is also converted into plasma, thereby removing the mask. When the surface of the wafer W reaches the state shown in FIG. 3A, the supply of the etching gas is stopped and the high-frequency power supply 55 is turned off. Then, the $N_2$ gas is discharged from the shower head 54, and the inside of the process container 51 becomes an $N_2$ gas atmosphere. At the time of each etching process, the temperature of the mounting table 53 is set to, for example, the room temperature so that the temperature of the wafer W becomes a temperature at which the protective film 15 is not decomposed, for example, a temperature of 200 degrees C. or less.

Oxygen is removed from the process container 51 by purging the inside the process container 51 with the $N_2$ gas and evacuating the inside of the process container 51. Then, when the low oxygen concentration atmosphere described above is formed in the process container 51, the temperature of the wafer W is increased by the heater 50. When the temperature of the wafer W reaches a temperature of 300 degrees C. or more as described above, the depolymerization occurs and the protective film 15 is removed as shown in FIG. 3B. Alternatively, in this etching apparatus 5, the low oxygen atmosphere may be formed by only evacuating the inside of the process container 51 without supplying the $N_2$ gas into the process container 51. Also, instead of the $N_2$ gas, another inert gas such as an Ar gas or the like may be supplied.

Figure 8:
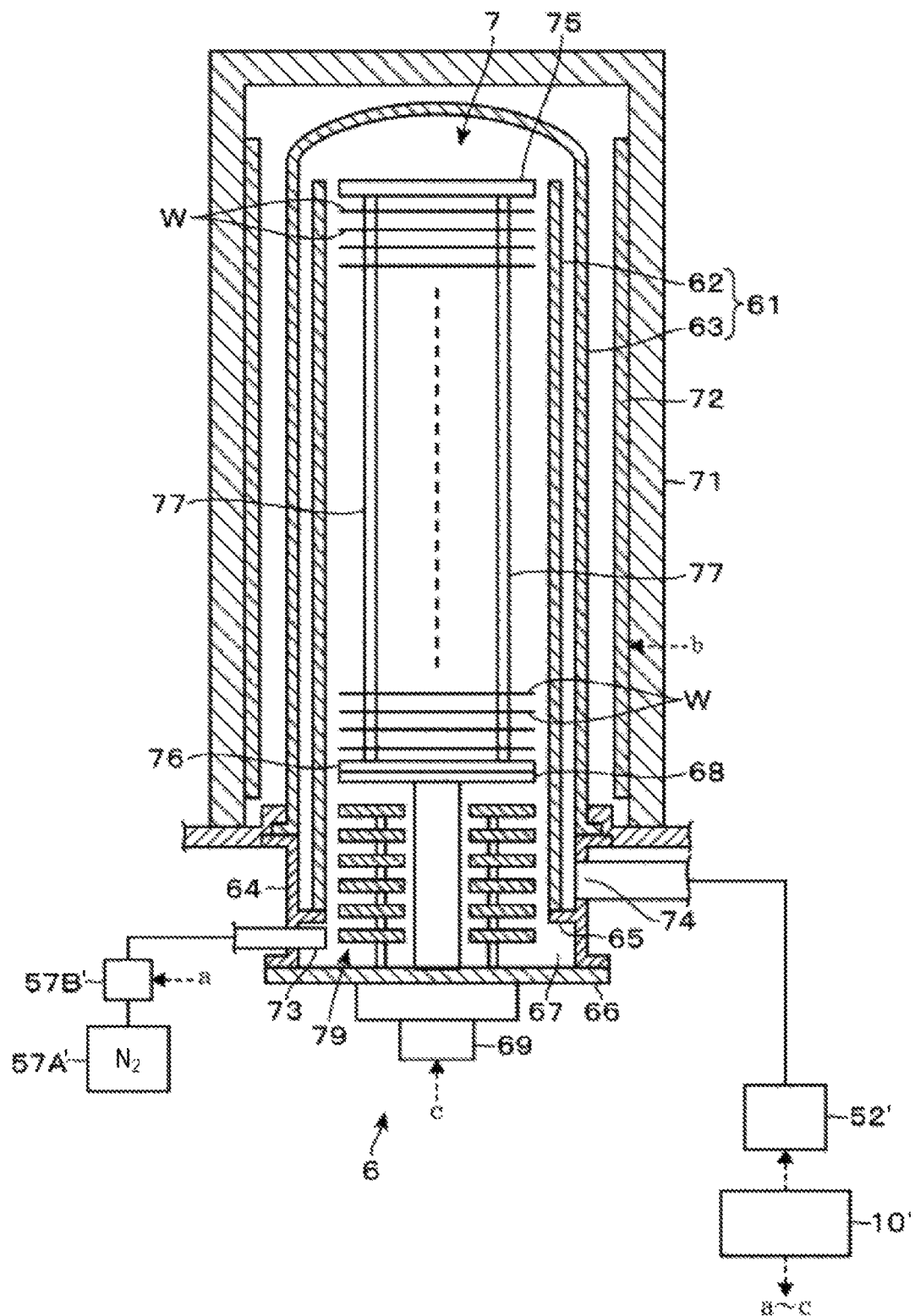
FIG. 8 is a vertical sectional side view of a vertical heat treatment apparatus for depolymerizing polyurea in the semiconductor device manufacturing process.
Figure 9A:
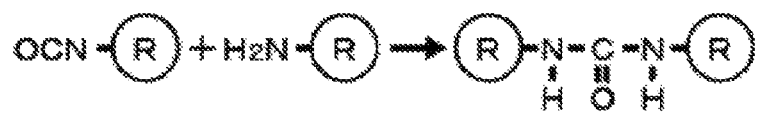
FIGS. 9A to 9D are explanatory views showing reactions in which a polymer having a urea bond becomes an oligomer.
Figure 9B:
Figure 9C:
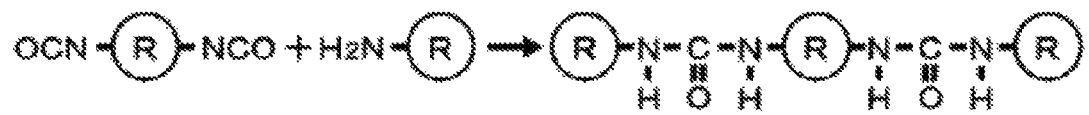
Figure 9D:
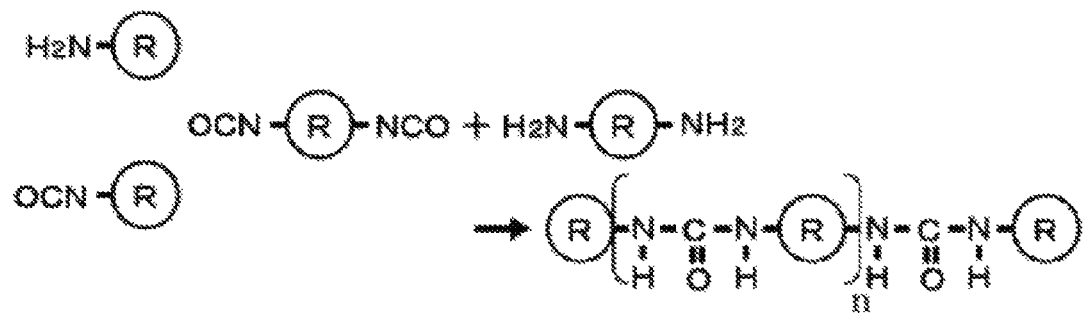

However, if the depolymerization is carried out after the etching is performed in the etching apparatus 5 as described above, it may take in some cases a relatively long time from the completion of the etching until the temperature of the wafer W is raised to the depolymerization temperature. In order to prevent the productivity of the memory device from being lowered due to the above-described time required for the temperature adjustment, in some embodiments, after the etching is performed in the etching apparatus 5 as described above, the wafer W may be transferred to a heating apparatus outside the etching apparatus 5 without removing the protective film 15, and the protective film 15 may be removed in the heating apparatus. That is to say, the heating process for depolymerization and the etching process may be performed in separate process containers. FIG. 8 shows a vertical heat treatment apparatus 6 which is an example of the heating apparatus. The vertical heat treatment apparatus 6 includes a reaction container 61, which is a substantially cylindrical vacuum container having a longitudinal direction of the reaction container 71 oriented in a vertical direction. The reaction container 61 has a double tube structure, which is composed of an inner tube 62 and a roofed outer tube 63 that covers the inner tube 62 and is spaced apart from the inner tube 62 by a certain distance. The inner tube 62 and the outer tube 63 are made of heat-resistant material, for example, quartz.

A cylindrical manifold 64 made of stainless steel (SUS) is disposed below the outer tube 63. The manifold 64 is airtightly connected to the lower end of the outer tube 63. The inner tube 62 is supported by a support ring 65 that protrudes from the inner wall of the manifold 64 and is integrally formed with the manifold 64.

A lid 66 is disposed below the manifold 64. The lid 66 is configured to be vertically movable between a raised position and a lowered position by a boat elevator (not shown). FIG. 8 shows the lid 66 located at the raised position. In the raised position, the lid 66 closes the opening 67 of the reaction container 61 on the lower side of the manifold 64, thereby keeping the inside of the reaction container 61 airtight. A mounting table 68 is provided on the top of the lid 66. A wafer boat 7 as a substrate holder is mounted on the mounting table 68. Reference numeral 79 in FIG. 8 denotes a heat insulating member provided between the mounting table 68 and the lid 66. Reference numeral 69 in FIG. 8 denotes a rotation mechanism provided at the lid 66. The rotation mechanism 69 rotates the mounting table 68 about the vertical axis during the heating process of the wafer W.

A heat insulator 71 is installed around the reaction container 61 so as to surround the reaction container 61. A heater 72 composed of, for example, a resistance heating body as a heating part, is installed on the inner wall surface of the heat insulator 71 so as to heat the reaction container 61. A nozzle 73 passes through the manifold 64 at a portion below the support ring 65. The nozzle 73 is connected to an $N_2$ gas supply source 57A' via a flow rate adjustment part 57B' and supplies an $N_2$ gas into the inner tube 62. One end of an exhaust pipe 74 for evacuating the interior of the reaction container 61 is connected to the side surface of the manifold 64 at a portion above the support ring 65, and the other end of the exhaust pipe 74 is connected to an exhaust mechanism 52'.

The wafer boat 7 will now be described. The wafer boat 7 includes a top plate 75 and a bottom plate 76 that face each other. The top plate 75 and the bottom plate 76 are formed in a horizontal posture and are horizontally connected to one ends and the other ends of three vertically extending support columns 77 (only two of which are shown in FIG. 8). A plurality of support portions (not shown) for supporting back surfaces of wafers W is provided along the vertical direction in each support column 77. By being supported on these support portions, a plurality of wafers W is held in a shelf shape at intervals in the vertical direction. Further, the vertical heat treatment apparatus 6 is also provided with a controller 10'. A control signal is transmitted to respective components according to a program included in the controller 10'. An exhaust amount by the exhaust mechanism 52', a flow rate of the $N_2$ gas supplied to the reaction container 61 and adjusted by the flow rate adjustment part 57B', an electric power supplied to the heater 72, a rotation speed of the wafer boat 7 rotated by the rotation mechanism 69, and the like are controlled by the control signal.

Operation of the vertical heat treatment apparatus 6 will be described. A plurality of wafers W etched in the etching apparatus 5 as described above and having contact holes 19 formed as shown in FIG. 3A is mounted on the wafer boat 7. The wafer boat 7 is mounted on the mounting table 68. Then, the reaction container 61 is closed by the lid 66. The $N_2$ gas is supplied into the reaction container 61 and the interior of the reaction container 61 is evacuated, thereby forming the aforementioned low oxygen atmosphere. Then, the temperature inside the reaction container 61 is raised to the aforementioned polyurea depolymerization temperature by the heater 72, whereby the protective film 15 made of polyurea is removed as shown in FIG. 3B. The apparatus for removing the protective film 15 in this way may be a batch type apparatus for collectively processing a plurality of wafers W as in the vertical heat treatment apparatus 6, or may be a single wafer type apparatus for processing a single wafer W as described with reference to FIG. 7.

In the process of FIGS. 1A to 3C, a detailed description of an apparatus for forming a film other than the protective film 15 such as the electrode film 14 or the like is omitted. However, the film formation can be performed by using, for example, an apparatus having the same configuration as that of the coating apparatus 3 described in FIG. 5 or the film forming apparatus 4 described in FIG. 6 while supplying a chemical liquid or a film-forming gas corresponding to a film to be formed to the wafer W. Each etching process among the processes of FIGS. 1A to 3C can be performed by using, for example, an etching apparatus having the same configuration as that of the etching apparatus 5 described in FIG. 7 while supplying an etching gas corresponding to a film to be etched to the wafer W.

As shown in FIGS. 9A to 9D, mono-functional molecules may be used as raw material monomers when forming polyurea by copolymerization. Alternatively, as shown in FIGS. 10A and 10B, isocyanate and secondary amine may be used. The bond contained in the polymer produced in this case is also a urea bond.

Figure 11:
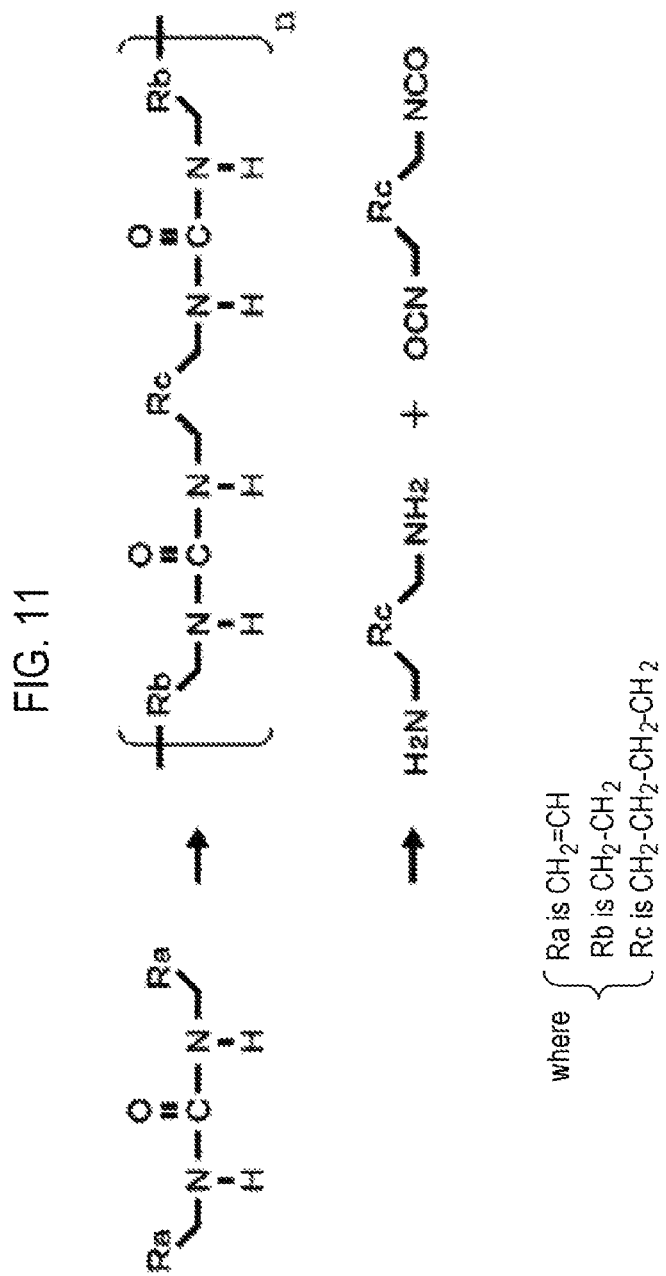
FIG. 11 is an explanatory view showing a configuration of atomic groups constituting isocyanate and amine.

A polyurea film may also be obtained by polymerizing raw material monomers having a urea bond. In this case, the raw material monomers may be supplied to the wafer W in the state of liquid, mist, or vapor. FIG. 11 shows such an example. By irradiating light, for example, ultraviolet rays, and applying light energy to the raw material monomers, polymerization takes place and a polyurea film is produced. If the polyurea film is heated at, for example, 350 degrees C., the polyurea film is depolymerized into isocyanate and amine.

Figure 12:
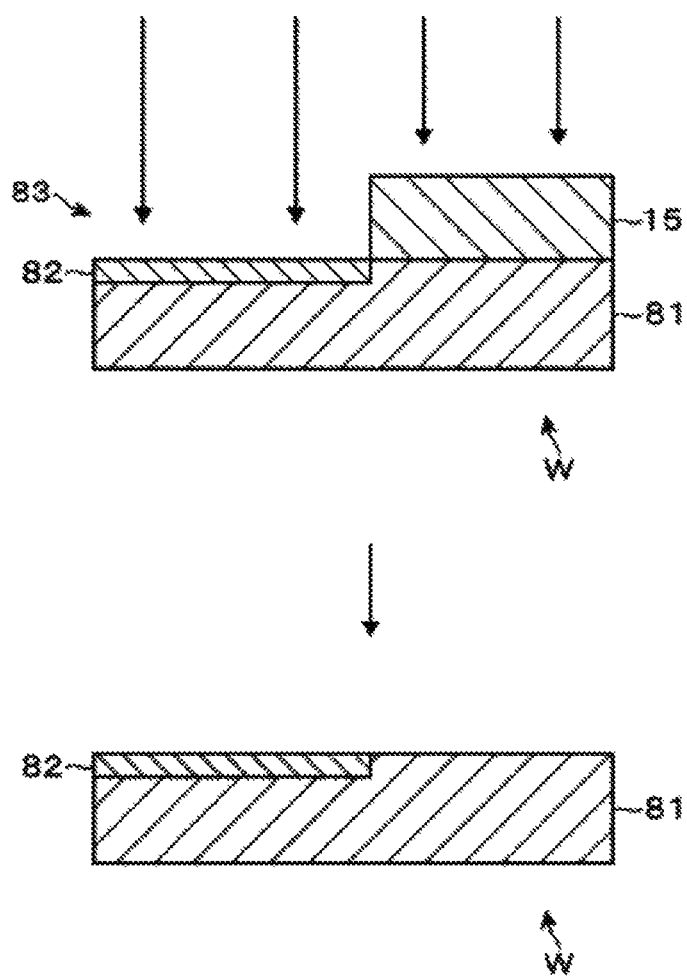
FIG. 12 is an explanatory view showing a part of the semiconductor device manufacturing process according to the embodiment of the present disclosure.

The polyurea film may be also formed as a sacrificial film for other uses than the protective film 15 described above. For example, when ion implantation is limitedly performed to a predetermined region 82 of an ion implantation layer 81 on the surface of the wafer W in order to form a p-MOS or an n-MOS constituting a semiconductor device, the protective film 15 is formed as a mask on the ion implantation layer 81 as shown in FIG. 12. In the ion implantation layer 81, a region covered with the protective film 15 and protected so as not to undergo ion implantation forms a protected layer. After the ion implantation is limitedly performed to the predetermined region 82 through an opening 83 formed in the protective film 15, as described with reference to FIG. 3B, the protective film 15 is removed by heating under the low oxygen atmosphere. Furthermore, the protective film 15 as a sacrificial film may be formed as an etching mask on a layer to be etched. After a predetermined region of a film to be etched is limitedly etched through the opening 83 of the protective film 15 thus formed, the protective film 15 is removed by the above-described removal process.

The present disclosure is not limited to the process of forming the protective film 15 of polyurea as a sacrificial film for protecting an underlying film and then removing the protective film 15. An embodiment in which the protective film 15 is not formed and removed as described above will be described with reference to FIG. 13. In this embodiment, the present disclosure is applied to a process of forming a conductive path of a semiconductor device on a wafer W by dual damascene. In FIGS. 13A to 13D, reference numeral 91 denotes an interlayer insulating film on the lower layer side, reference numeral 92 denotes copper forming a conductive path embedded in the interlayer insulating film 91, and reference numeral 93 denotes an etching stopper film made of SiC (silicon carbide) and the like. The etching stopper film 93 functions as a stopper at the time of etching. A low dielectric constant film 94 as an interlayer insulating film is formed on the etching stopper film 93. The low dielectric constant film 94 is, for example, a SiOC (carbon-containing silicon oxide) film. The SiOC film is a porous body. In FIG. 13A, pores of the low dielectric constant film 94 are schematically indicated by reference numeral 95.

For example, a raw material gas containing isocyanate (referred to as a first raw material gas) and a raw material gas containing amine (referred to as a second raw material gas) are alternately and repeatedly supplied to the low dielectric constant film 94. The respective gases enter the pores 95 of the low dielectric constant film 94 and react with each other in the pores 95 as described in FIG. 4, whereby a protective material 96 made of polyurea is formed so as to be embedded in the pores 95 (FIG. 13B). The first raw material gas and the second raw material gas may be supplied to the wafer W using the film forming apparatus 4 described in FIG. 6. The protective material 96 may be regarded as a film embedded in the pores 95 of the low dielectric constant film 94.

The first raw material gas and the second raw material gas may be simultaneously supplied to the wafer W, or may be alternately and repeatedly supplied to the wafer W. When alternately and repeatedly supplying the first raw material gas and the second raw material gas as described above, for example, a period for supplying a purge gas such as an $N_2$ (nitrogen) gas or the like into the vacuum container 40 is set between a period of supplying the first raw material gas and a period of supplying the second raw material gas. That is to say, the protective material 96 may also be formed on the low dielectric constant film 94 by atomic layer deposition (ALD) in addition to CVD. In order to supply the purge gas to the wafer W as described above, for example, the respective pipes 41c and 42c in the film forming apparatus 4 are branched into two branches at the upstream side of the pipes 41c and 42c. In each of the pipes 41c and 42c, one of the branches at the upstream side is connected to the raw material supply source 41a or 42a, and the other one of the branches at the upstream side is connected to a purge gas supply source.

After embedding the protective material 96 in the pores 95, an etching mask is formed on the low dielectric constant film 94 and the low dielectric constant film 94 is etched. Then, the etching mask is removed by etching, whereby a recess (groove for embedding a wiring) constituting a via hole and a trench is formed in the low dielectric constant film 94. Each of the etching processes can be performed by plasma etching using the etching apparatus 5 described with reference to FIG. 7. Since the protective material 96 is embedded as described above, damage to the low dielectric constant film 94 is suppressed when performing each of the etching processes.

The suppression of damage will be specifically described. The SiOC film constituting the low dielectric constant film 94 has a Si—C bond. However, on the exposed surface of the SiOC film exposed to plasma, i.e., on the side wall and the bottom surface of the recess, for example, the Si—C bond is broken by plasma and C is desorbed from the film. A state of Si having an unsaturated bond generated by the desorption of C is unstable. Thus, Si is bonded to, for example, moisture in the atmosphere and forms a Si—OH bond constituting a damaged layer. However, by embedding the protective material 96 in the pores 95, a region of the low dielectric constant film 94 exposed to the plasma is reduced, and formation of such a damaged layer is suppressed.

After forming the recess in the low dielectric constant film 94, a barrier layer 97 composed of, for example, a laminated film of Ti and TiON is formed, and copper 98 constituting a conductive path is embedded in the recess, whereby a circuit part is formed on the upper layer side (FIG. 13C). The barrier layer 97 is a film for preventing diffusion of the copper 98 into the low dielectric constant film 94. Thereafter, the wafer W is heated under a low oxygen atmosphere as in the case of removing the protective film 15, whereby the protective material 96 is depolymerized and removed from the pores 95 (FIG. 13D). Even in the case of removing the protective material 96 as a filling material for the pores 95 in this manner, the residue generated due to oxidation of the protective material 96 is prevented from remaining on the low dielectric constant film 94. This makes it possible to prevent the residue from affecting quality of the manufactured semiconductor product. The respective processes from the formation of the protective material 96 to the removal of the protective material 96 are performed at a temperature at which the protective material 96 is not removed by depolymerization. The present disclosure is not limited to the embodiments described above, and the examples shown in the respective embodiments may be appropriately changed or combined with each other.

(Evaluation Test)

After supplying H6XDI and H6XDA to a substrate heated to 90 degrees C., the substrate was heated at 250 degrees C. for 5 minutes to form a polyurea film. The average value of the film thicknesses in the respective portions of the polyurea film was 500 nm. In an evaluation test 1-1, an $N_2$ gas was supplied at a flow rate of 200 mL/min into a chamber in which the substrate provided with the aforementioned polyurea film having a weight of 5 mg is placed, thereby creating a nitrogen atmosphere in which an oxygen concentration in the chamber is 50 ppm or less. Then, the substrate was heated in the $N_2$ gas atmosphere to raise the temperature of the substrate from the room temperature to 1,000 degrees C. with a temperature increasing rate of 10 degrees C./min. The weight of the substrate during the temperature rise and the heat generation amount of the substrate were measured. In an evaluation test 1-2, the same test as in the evaluation test 1-1 was performed except that instead of the $N_2$ gas, an air is supplied to the chamber at a flow rate of 200 mL/min That is to say, in the evaluation test 1-2, the substrate was heated under an atmosphere having a higher oxygen concentration than in the evaluation test 1-1. In the evaluation test 1-1, the substrate was heated under a low oxygen atmosphere.

Figure 15:
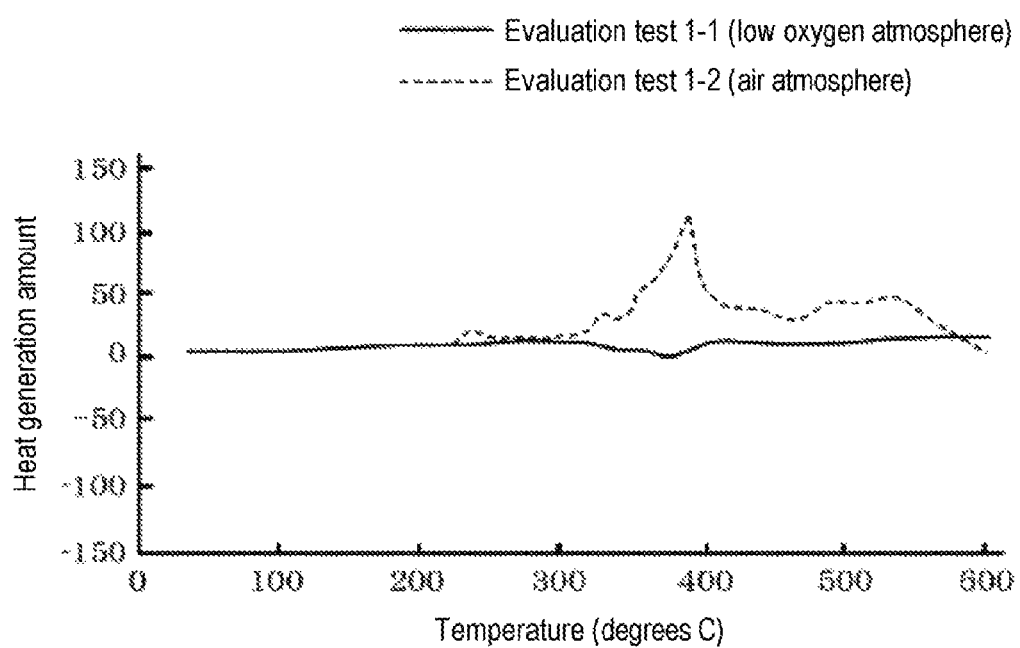
FIG. 15 is a graph showing results of an evaluation test.

The graph of FIG. 14 shows the test results on the weight of the substrate. The horizontal axis of the graph indicates the temperature (unit: degrees C.) of the substrate, and the vertical axis of the graph indicates the ratio (unit: %) of the weight of the substrate given that the weight of the substrate before heating is 100%. The graph of FIG. 15 shows the test results on the heat generation amount. The horizontal axis of the graph indicates the temperature (unit: degrees C.) of the substrate, and the vertical axis of the graph indicates the magnitude of the heat generation amount. The larger numerical value on the vertical axis represents the larger heat generation amount. In both graphs of FIGS. 14 and 15, the solid line indicates the result of the evaluation test 1-1 and the dotted line indicates the result of the evaluation test 1-2.

From the graph of FIG. 14, it can be noted that in both of the evaluation test 1-1 and the evaluation test 1-2, the weight was reduced by about 5% before reaching 100 degrees C. due to desorption of water having been adsorbed to the substrate. In the evaluation test 1-1, the decrease in the weight of the substrate was suppressed to about 1% until the temperature of the substrate exceeds 100 degrees C. and reaches 300 degrees C. When the temperature exceeds 300 degrees C., the weight of the substrate decreased rapidly. The weight of the substrate was 0.5% or less at 500 degrees C. In the evaluation test 1-2, when the temperature of the substrate exceeded 300 degrees C., the weight of the substrate decreased sharply as in the evaluation test 1-1. The evaluation test 1-2 differs from the evaluation test 1-1 in that the decrease in the weight of the substrate had already been started when the temperature of the substrate reached 230 degrees C. In the evaluation test 1-2, when the temperature of the substrate reached 500 degrees C., the weight of the substrate was a relatively large value of about 13%. When the temperature reached 600 degrees C., the weight of the substrate was about 0.5%.

Further, from the graph of FIG. 15, it can be noted that in the evaluation test 1-1, the heat generation amount was not changed greatly while the temperature was raised from the room temperature to 600 degrees C. This indicates that oxidation of the polyurea film was suppressed in the evaluation test 1-1. On the other hand, in the evaluation test 1-2, the heat generation amount was larger than that of the evaluation test 1-1 in the vicinity of 230 degrees C. and from 300 degrees C. to 600 degrees C. This indicates that the oxidation reaction did not substantially occur in the evaluation test 1-1 until the temperature of the substrate was raised from the room temperature to 600 degrees C., but the oxidation reaction occurred in the evaluation test 1-2 in the vicinity of 230 degrees C. and from 300 degrees C. to 600 degrees C. Accordingly, it is considered that the decrease in the weight after the temperature of the substrate reached 230 degrees C. in the evaluation test 1-2 is due to decomposition of polyurea caused by the oxidation reaction with oxygen in the air. In addition, it is considered that the relatively large weight of the substrate when the temperature of the substrate reached 500 degrees C. in the evaluation test 1-2 was because products of the oxidation reaction remained as residues on the substrate.

As described above, in the evaluation test 1-1, as compared with the evaluation test 1-2, the oxidation was suppressed so as to obtain a high heat resistance, and it was possible to remove the polyurea film at a lower temperature so that residues did not remain on the substrate. The fact that polyurea can be removed at such a low temperature means that the semiconductor device formed on the wafer can be prevented from being damaged by heat. Accordingly, it was confirmed from the evaluation tests 1-1 and 1-2 that, by setting the oxygen concentration to 50 ppm or less when depolymerizing the polyurea film, it is possible to sufficiently suppress generation of oxides and suppress adhesion of residues to the substrate, thereby sufficiently obtaining the effects of the present disclosure.

Since a rate of depolymerization of the polyurea film varies with a temperature increasing rate, the result of the evaluation tests 1-1 and 1-2 does not indicate that the polyurea film is not removed unless the temperature reaches 500 degrees C. At a temperature of 400 degrees C. or higher, the change in the weight of the substrate shows different behaviors in the evaluation test 1-1 and the evaluation test 1-2. This may be possibly due to the difference in oxygen concentration between the environment of the evaluation test 1-1 and the environment of evaluation test 1-2.

According to the present disclosure, in order to protect a protection target layer, a substrate on which a protective material composed of a polymer having a urea bond is formed is heated under a low oxygen atmosphere to depolymerize the polymer, thereby removing the protective material. By heating the substrate under the low oxygen atmosphere, it is possible to prevent the polymer and compounds generated by the depolymerization from being oxidized and remaining as residues on the substrate. Thus, it is possible to suppress deterioration of quality of a semiconductor device.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   forming a protective material composed of a polymer having a urea bond by supplying a raw material for polymerization to a surface of a substrate for manufacturing the semiconductor device, the protective material configured to protect a protection target layer provided in the substrate against a treatment to be performed on the substrate;
   subsequently performing the treatment on the substrate on which the protective material is formed; and
   subsequently removing the protective material by heating the substrate under a low oxygen atmosphere to depolymerize the polymer.

2. The method of claim 1, wherein the protective material is a sacrificial film formed on the protection target layer.

3. The method of claim 2, wherein the protection target layer is a metal film constituting a conductive path of the semiconductor device, and the protective material is formed by being laminated on the metal film.

4. The method of claim 1, wherein the protection target layer is a porous body, and the protective material is formed by being embedded in the porous body.

5. The method of claim 1, wherein the low oxygen atmosphere is an atmosphere having an oxygen concentration of 200 ppm or less.

6. The method of claim 1, wherein the removing the protective material further includes heating the substrate to a temperature lower than 400 degrees C. for five minutes or less.

* * * * *